(12) United States Patent
Engelhardt et al.

(10) Patent No.: US 9,036,352 B2
(45) Date of Patent: May 19, 2015

(54) PHASE CHANGE HEAT SINK FOR TRANSIENT THERMAL MANAGEMENT

(71) Applicant: GE Aviation Systems LLC, Grand Rapids, MI (US)

(72) Inventors: Michel Engelhardt, Woodbury, NY (US); Paul Otto Stehlik, Northport, NY (US); Lawrence Joseph Hannaford, Jr., Sayville, NY (US)

(73) Assignee: GE Aviation Systems, LLC, Gran Rapids, MI (US)

( * ) Notice: Subject to any disclaimer, the term of this patent is extended or adjusted under 35 U.S.C. 154(b) by 245 days.

(21) Appl. No.: 13/690,029

(22) Filed: Nov. 30, 2012

(65) Prior Publication Data
US 2014/0153193 A1 Jun. 5, 2014

(51) Int. Cl.
H05K 7/20 (2006.01)
F28D 15/02 (2006.01)
H01L 23/427 (2006.01)
F28D 15/00 (2006.01)
H05K 1/02 (2006.01)

(52) U.S. Cl.
CPC .............. *F28D 15/02* (2013.01); *H01L 23/427* (2013.01); *F28D 15/00* (2013.01); *H05K 1/021* (2013.01); *H01L 2924/0002* (2013.01)

(58) Field of Classification Search
USPC .................................... 361/710, 720
See application file for complete search history.

(56) References Cited

U.S. PATENT DOCUMENTS

| | | | |
|---|---|---|---|
| 4,322,737 A | 3/1982 | Sliwa, Jr. | |
| 5,597,035 A | 1/1997 | Smith et al. | |
| 5,631,799 A | 5/1997 | Sayka | |
| 6,239,502 B1 | 5/2001 | Grewe et al. | |
| 7,940,527 B2 | 5/2011 | Krause | |
| 7,989,839 B2 | 8/2011 | Dahm | |
| 8,081,465 B2 | 12/2011 | Nishiura | |
| 2003/0221812 A1* | 12/2003 | Hsiao et al. | 165/10 |
| 2004/0250989 A1 | 12/2004 | Im et al. | |
| 2008/0123297 A1 | 5/2008 | Tilton et al. | |
| 2008/0130242 A1* | 6/2008 | Hsieh | 361/719 |
| 2009/0184283 A1* | 7/2009 | Chung et al. | 252/67 |
| 2010/0321892 A1* | 12/2010 | Vander Ploeg et al. | 361/707 |

* cited by examiner

*Primary Examiner* — Andargie M Aychillhum
(74) *Attorney, Agent, or Firm* — General Electric Company; William S. Munnerlyn

(57) ABSTRACT

A heat dissipating assembly, for dissipating heat, having at least one heat producing component and a heat sink having phase change material conductively coupled to the at least one heat producing component.

15 Claims, 4 Drawing Sheets

PHASE CHANGE HEAT SINK FOR TRANSIENT THERMAL MANAGEMENT

BACKGROUND OF THE INVENTION

Heat producing devices, such as printed circuit boards, often contain heat producing components, such as processors or voltage regulators. A thermal plane may be provided in combination with the heat producing devices to form an assembly to aid in the removal of heat, typically by providing additional conductive pathways to disperse the heat. Typically, air cooling and liquid cooling systems are used in open environments where the heat may be dissipated to the surroundings. In certain instances, the heat producing components may operate under transient modes of increased heat production where high heat dissipations are expected over short durations. The transient mode may exceed the capacity of the cooling system, unless the cooling system is sized for the worst-case transient response, which results in over capacity for steady-state operation.

BRIEF DESCRIPTION OF THE INVENTION

In one aspect, a heat dissipating assembly includes at least one heat producing component and a heat sink having phase change material conductively coupled to the at least one heat producing component, wherein the phase change material changes between at least two phases in response to the conductive transfer of heat from the heat producing component to the phase change material.

DESCRIPTION OF EMBODIMENTS OF THE INVENTION

Figure 1:
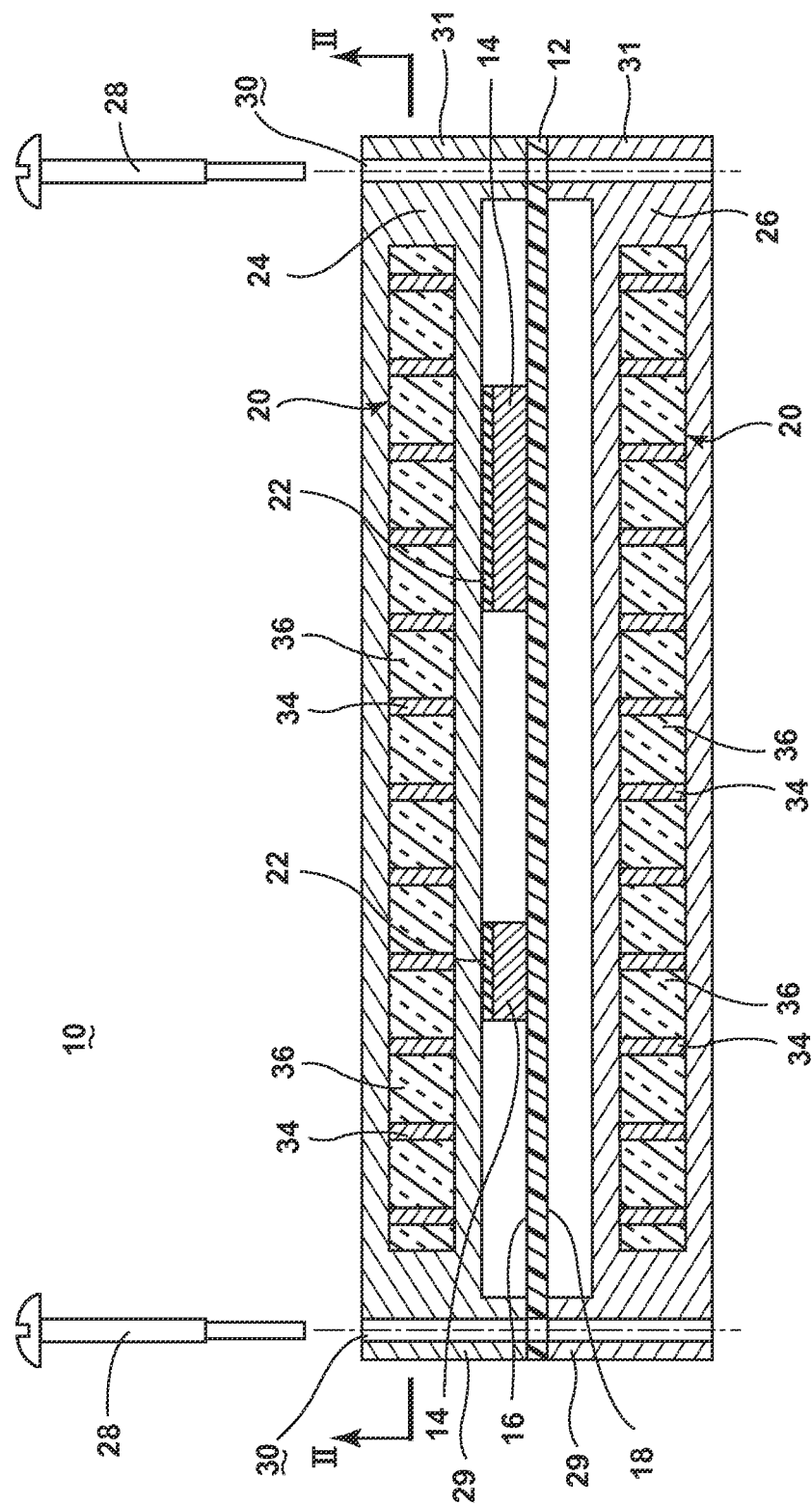
FIG. 1 is a schematic cross sectional view of a printed circuit board assembly where a heat producing component is in indirect conductive contact with the heat sink according to one embodiment of the invention.

The embodiments of the present invention are related to a heat dissipating assembly comprising at least one heat producing component. In the embodiment of FIG. 1, a printed circuit board (PCB) assembly 10 is shown comprising a PCB, exemplified as a pulse laser control board (PLCB) 12 to operate a pulse laser apparatus (not shown), having heat producing components 14, shown as microprocessors, on the PLCB top surface 16. Pulse lasers are known to operate at high power requirements, causing high heat production in the PCB components, for short periods of time (on the order of seconds). Although microprocessors are illustrated, additional heat producing components 14, such as power regulators, resistors, inductors, capacitors, etc., may be provided on the PCB.

The PCB assembly 10 further comprises thermal planes 24, 26 having a heat sink 20, and thermal pads 22, conductively coupling the heat producing component to at least one of the thermal planes 24, 26. The thermal planes are shown as an upper thermal plane 24 and a lower thermal plane 26, each at least partially encompassing the top and bottom surfaces 16, 18 of the PLCB 12, respectively, and configured to mount to the PLCB 12. The thermal planes 24, 26 are illustrated as aluminum, which is efficient at conducting and dissipating heat. Alternately, the thermal planes 24, 26 may comprise any material able to efficiently conduct or dissipate heat. Although both an upper thermal plane 24 and lower thermal plane 26 are shown, further embodiments may have only a single thermal plane in proximity to the at least one heat producing component, or proximate to a heat dissipation need, as design considerations require.

The PCB assembly 10 further defines a fastening component that is provided to aid in the mounting of the upper thermal plane 24 and the lower thermal plane 26 to the PLCB 12. As illustrated, the fastening component comprises a fastener, shown as a screw 28, received through an opening 30 in the upper thermal plane 24, PLCB 12, and lower thermal plane 26. Any suitable fastening component may be used. For example, other mechanical fasteners, e.g. bolts, nails, pins, etc., may be used as well as non-mechanical fasteners, such as welding or adhesive. Alternatively, the screw 28 may couple the upper and lower thermal planes 24, 26 directly to each other, wherein the PLCB 12 will be partially or entirely contained within the planes 24, 26.

The thermal planes may further be fastened using a screw-on clamp at two opposing side ends 29, 31 of each upper and lower thermal planes 24, 26. The upper thermal plane 24 is clamped to the lower thermal plane 26 to obtain a low compressive force (e.g. 0.023 to 0.069 m-kg) on to the PLCB 12 components.

In a sense, these clamps provide for a clamshell mount of the upper and lower thermal planes 24, 26 about the PLCB 12. The coupling of the upper and lower thermal planes 24, 26, regardless of the manner of coupling, results in a housing structure that contains the PLCB 12 in a manner similar to a clamshell. While not necessary, it is contemplated for the upper and lower thermal planes 24, 26 to be hinged along one edge to have a true clamshell configuration. However, as used in this description, the term clamshell is not limited to a hinged coupling. This clamshell arrangement allows for ease of assembly and disassembly during maintenance of the PLCB 12.

The thermal pads 22, illustrated as conductive putty, provide for physical contact and reliable thermal conduction between the heat producing component 14 and the upper thermal plane 24, as shown. Alternate embodiments of thermal pads may include thermal paste, or adhesive-type materials with suitable conductive properties.

Figure 2:
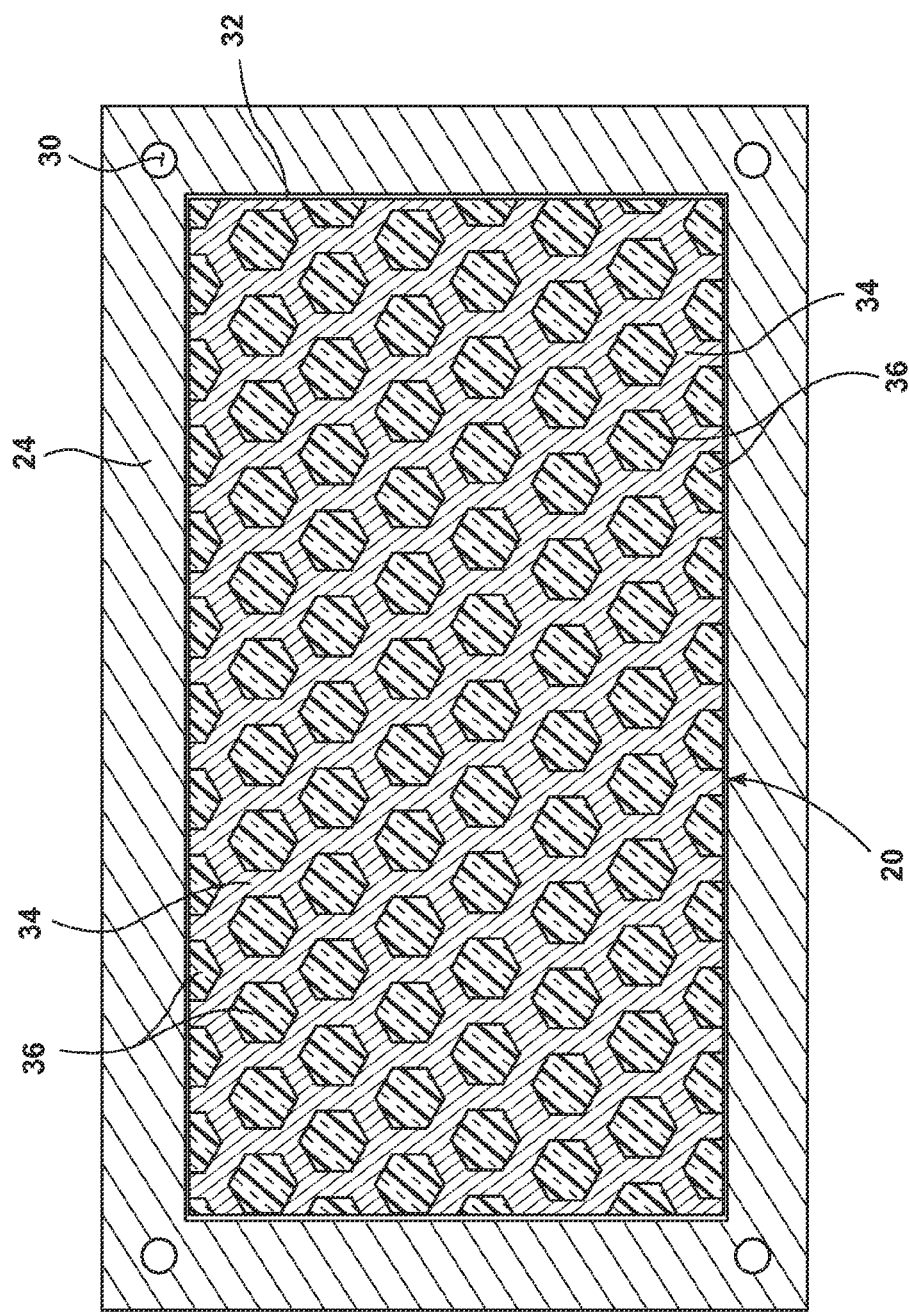
FIG. 2 is a schematic cross sectional view taken along line 2-2 of FIG. 1 showing the heat sink.

Turning now to FIG. 2, the details of the heat sink 20 will be described. The heat sink 20 is defined by an inner wall 32 and includes a conductive frame 34 defining a plurality of chambers 35 in which the phase change material 36 is received. As illustrated, the frame 34 is illustrated as a grid of interconnected walls, which happen to define a honeycomb cross section, but other cross sections are contemplated. However, other types of frame structures, both grid and non-grid, are contemplated. The frame 34 enhances the conduction of heat into and away from the phase change material 36 within the heat sink 20. The inner wall 32 is exemplified as an elastomer material for retaining the phase change material 36, but may be any type of material suitable for heat conduction.

The frame 34 shown operates to segregate the phase change material in separate chambers 35, while providing an interconnected heat conduction path from the upper thermal plane 24 to the inner geometric chambers 35 of the phase change material. Other materials, for example, copper, steel, nickel, or copper tungsten, etc., may provide similar structural and heat conductive properties functionality of frame 34, and provide design flexibility to incorporate or address concerns such as electromagnetic interference (EMI) protection, weigh, or thermal expansion/contraction. This aforementioned list of grid materials should not be considered exhaustive, but rather, examples of a wide range of materials suitable for particular applications.

The phase change material 36 is exemplified as paraffin wax ($CaCl_2*6H_2O$), a solid which changes phase to a liquid when sufficient heat is absorbed, and further changes phase from a liquid back to a solid when sufficient heat is released. A typical melting point of paraffin wax is between 46 and 68 degrees Celsius. After the phase change from solid to liquid, the paraffin wax is able to further absorb supplementary heat, beyond the heat causing the phase change to occur. The paraffin wax is configured to repeatedly change phase from a solid to a liquid, and back to a solid, reliably for multiple cycles.

Other phase change materials, for example ammonia, are envisioned, so long as the material changes phase from a starting phase to at least one different phase in response to the conductive transfer of heat. The starting phase and at least one different phase may be one of solid, liquid, and gas. In the current embodiment, the paraffin wax may also include an additive material, such as carbon black, to increase the radiation heat transfer emissivity.

During operation of the pulse laser, the heat producing component 14 on the PLCB 12 uses electrical power over short durations (on the order of seconds), creating a mode of high power consumption interspersed with modes of low power consumption, and as a result, the need for transient high heat dissipation during the high power consumption modes. During these transient durations, the heat produced by the heat producing component 14 is transferred by conduction to the thermal pad 22, followed by the upper and lower thermal planes 24, 26. The heat is then transferred to the heat sink 20 by the inner wall 32, with the frame 34 conducting the heat to the phase change material 36, where the heat is absorbed. In this sense, the phase change material 36 provides a physical material for heat storage during heat dissipation of the PCB during the transient duration. Upon the completion of the transient duration, the PCB assembly 10 will then shed the heat stored in the phase change material by conduction from the phase change material back to the thermal plane, via the frame 34, to the surrounding environment over time through radiation.

During exceptionally high heat or a prolonged transient heat condition, the phase change material 36 will melt, changing phase from a solid to a liquid or a liquid to a gas. This change of phase allows the phase change material 36 to absorb additional heat during the high heat transient cycle for later dissipation. In such a scenario, the liquid phase change material 36, upon subsequent heat release occurring during the low heat portion of the operation cycle, will phase change back to a solid.

By way of non-limiting example, in a typical example of a low power, greater duration heat dissipation condition, a 0.127 m by 0.1778 m PCB assembly comprising a thermal plane, and a heat sink with a honeycomb structure having 0.0051 m thickness of paraffin wax, said PCB assembly is able to maintain a constant temperature of a 10.7 Watt heat load for 30 minutes without the need for external cooling.

Additional heat dissipation devices may be used in conjunction with the exemplified embodiment, such as air cooling fins or liquid cooling channels, to provide for increased heat relief Moreover, the entire PCB assembly 10 structure may be coated or painted with a black, high emissivity, low gloss material to ensure effective radiation heat transfer to the surrounding environment.

The above-mentioned embodiment is an example of the heat sink 20 configured in indirect conductive contact with the heat producing component 14 (via the thermal pad 22 and thermal planes 24, 26). Alternatively, it is envisioned that the heat sink 20 may be configured to be in direct conductive contact with at least one heat producing component wherein the heat sink 20 and heat producing component have a common platform for heat transfer.

Figure 3:
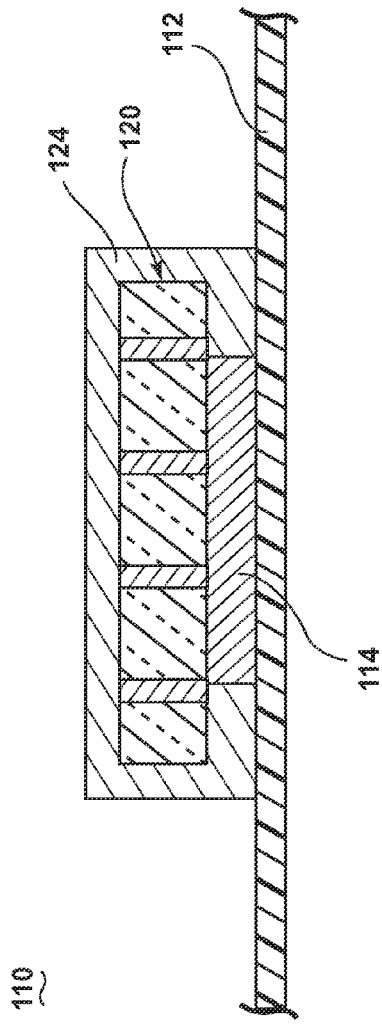
FIG. 3 is a schematic cross sectional view of a printed circuit board assembly where a heat producing component is in direct conductive contact with the heat sink according to a second embodiment of the invention.

FIG. 3 illustrates an alternative PCB assembly 110 according to a second embodiment of the invention. The second embodiment is similar to the first embodiment; therefore, like parts will be identified with like numerals increased by 100, with it being understood that the description of the like parts of the first embodiment applies to the second embodiment, unless otherwise noted. A difference between the first embodiment and the second embodiment, as illustrated, is that the upper thermal plane 124 is configured to receive only a single heat producing component, placing the heat sink 120 in direct conductive contact with the heat producing component 114, instead of full PLCB 112 coverage and indirect conductive contact of the first embodiment. As illustrated, the second embodiment further lacks the thermal pad of the first embodiment.

In this embodiment, the upper thermal layer 124 and heat sink 120 are configured or formed with protrusions and ridges with precision tolerance to mate directly over the heat producing component 114.

Many other possible embodiments and configurations in addition to that shown in the above figures are contemplated by the present disclosure. For example, one embodiment of the invention contemplates the thermal planes 24, 26 having indirect or direct conductive contact with the full PLCB surfaces 16, 18 or only a portion of the PLCB surfaces 16, 18. Likewise, the thermal planes 24, 26 may have indirect or direct conductive contact with the full heat producing components 14 surface, or only a portion of the heat producing component 14 surfaces. In direct contact configurations, the thermal pad would not be needed. Although a thermal pad or similar material may be provided to ensure complete contact with the thermal plane and the heat producing component.

While the heat sink 20 is shown at least partially embedded within each of the thermal planes 24, 26, other configurations are contemplated. The heat sink 20 may be completely embedded within one or both of the thermal planes 24, 26. The heat sink 20 may reside on one or both of an upper or lower surface of one or both of the thermal planes 24, 26. The heat sink 20 may be integrally formed with at least one of the thermal planes 24, 26. Alternatively, the heat sink 20 may be mounted to at least one of the thermal planes 24, 26.

Figure 4:
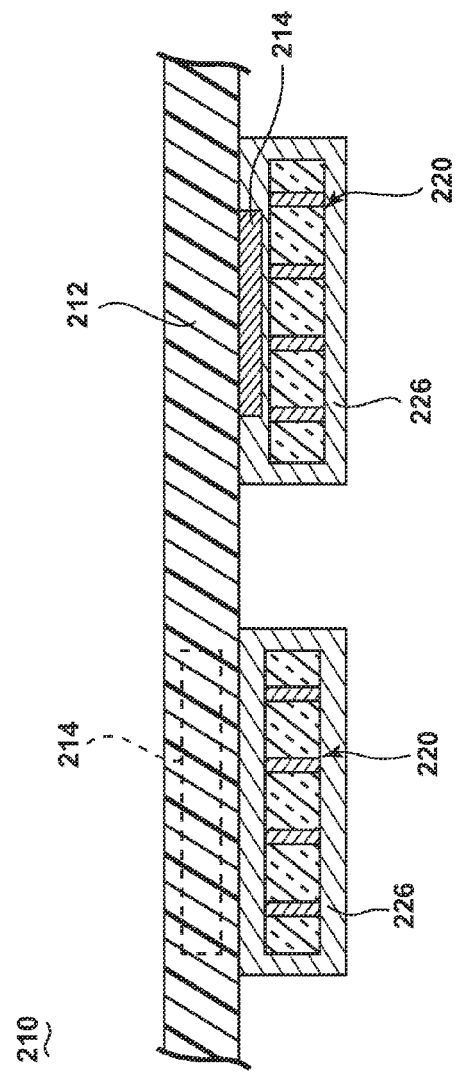
FIG. 4 is a schematic cross sectional view of a printed circuit board assembly showing an alternate heat producing component placement.

Additionally, the design and placement of the various components may be rearranged such that a number of different configurations could be realized. For example, FIG. 4 illustrates alternate assemblies of the PLCB 212, including placement of heat producing components 214, such as microprocessors on the PLCB bottom surface 218, or even integrated within the PLCB 212, are encompassed by the one embodiment of the invention. As shown, the heat sinks 220 are in indirect contact with each heat producing component 214, via a lower thermal plane 226.

Figure 5:
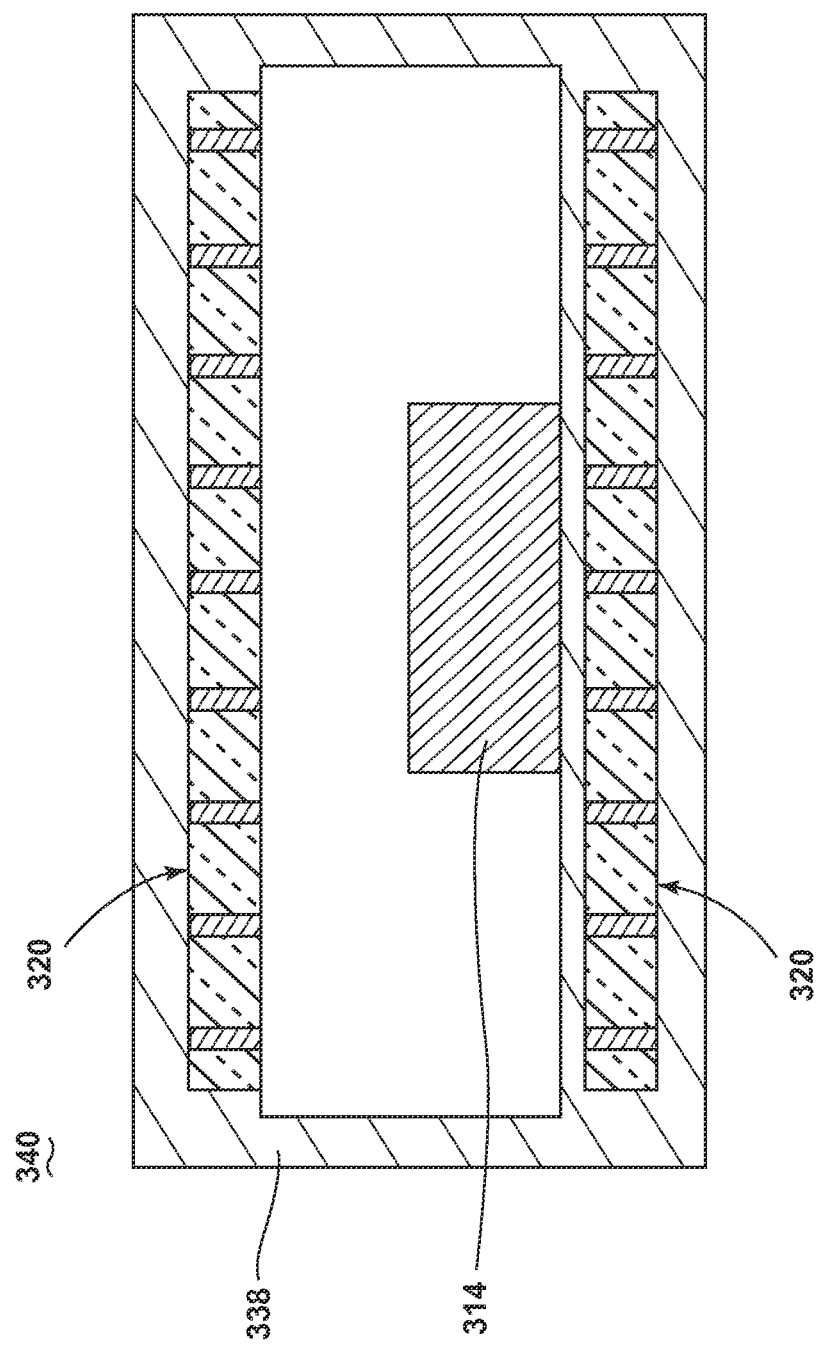
FIG. 5 is a schematic cross sectional of a chassis assembly where a heat producing component is in indirect conductive contact with the heat sink according to one embodiment of the invention.

Furthermore, non-PCB assemblies are included. For example, FIG. 5 illustrates a different type of assembly that requires heat dissipation. In FIG. 5, a pulse radar chassis assembly 340 is shown, comprising a heat producing component 314, a chassis 338, and heat sinks 320. While a pulse radar chassis assembly 340 is shown, any chassis having a heat producing component that requires heat dissipation, such as a high power microwave chassis, a radio transmitting chassis, etc., is envisioned. Although the pulse radar chassis assembly 340 is shown having heat sinks 320 in indirect contact with the heat producing component 314, alternate configurations, as described herein, are envisioned.

It is contemplated that any of the embodiments may be combined. For example, the embodiments of FIGS. 1 and 4 may be combined to locate the heat producing components on both the upper and lower surface of the PCB. One or more of these heat producing elements may have an individual heat sink according to the embodiment of FIG. 3, while the remaining heat producing elements are connected to the heat sink according to the embodiment of FIG. 1. It is further contemplated that the heat sinks of embodiments of FIGS. 1 and 3 may be combined resulting in "stacked' heat sinks.

The embodiments disclosed herein provide a PCB assembly having a heat sink with phase change material. One advantage that may be realized in the above embodiments is that the above described embodiments have superior weight and size advantages over the conventional type PCB assemblies having air cooling fins or liquid cooling components. With the proposed phase change material heat sink arrangement, a high heat dissipation can be achieved during transient heat conditions without additional heat dissipation elements since the reliable heat absorption of the phase change material is inherent, providing heat storage with the physical material for later release during lower heat production conditions.

Moreover, higher PCB reliability can be achieved even when components do not have high heat transient conditions because the phase change material provides exceptional heat dissipation properties during steady state operation or reduced environmental cooling conditions, such as changes to environmental temperature under high solar settings. Additionally, one aspect of the invention lowers the required enthalpy of a liquid or air heat exchanger needed to cool electronics during transient thermal cycles since the enthalpy is not designed for transient loads, but rather steady loads.

When designing PCB assemblies, important factors to address are size, weight, and reliability. The above described PCB assemblies have a decreased number of parts and less electrical draw compared to a PCB assembly having air or liquid cooling, making the complete system inherently more reliable. This results in a lower weight, smaller sized, increased performance, and increased reliability system. The lower number of parts and reduced maintenance will lead to a lower product costs and lower operating costs. Reduced weight and size correlate to competitive advantages.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A clamshell assembly for a printed circuit board (PCB) having at least one heat producing component, comprising:
    an upper thermal plane defining a first portion of the clamshell;
    a lower thermal plane spaced from the upper thermal plane to partially define a PCB chamber for holding the PCB and defining a second portion of the clamshell; and
    a heat sink with a phase change material mounted to one of the upper thermal plane and the lower thermal plane;
    wherein the first portion and second portion of the clamshell are coupled to define a housing structure that contains the PCB.

2. The clamshell circuit board assembly of claim 1 wherein the heat sink and the at least one heat producing component have a common platform.

3. The clamshell circuit board assembly of claim 1 wherein the heat sink is in indirect conductive contact with the at least one heat producing component.

4. The clamshell circuit board assembly of claim 3 further comprising a thermal pad forming at least a portion of a conductive path from the heat producing component and the heat sink.

5. The clamshell circuit board assembly of claim 1 wherein the phase change material changes between at least solid and liquid phases in response to a conductive transfer of heat from the heat producing component to the phase change material.

6. The clamshell circuit board assembly of claim 1 wherein at least a portion of the phase change material is aligned with the at least one heat producing component.

7. The clamshell circuit board assembly of claim 1 further comprising a thermal pad in direct thermal contact with the at least one heat producing component and at least one of the heat sink and the one of the upper and lower thermal planes to which the heat sink is mounted.

8. The clamshell circuit board assembly of claim 7 wherein the thermal pad is in direct thermal contact with the one of the upper and lower thermal planes to which the heat sink is mounted.

9. The clamshell circuit board assembly of claim 8 wherein the thermal pad and the heat sink are on opposite sides of the one of the upper and lower thermal planes to which the heat sink is mounted.

10. The clamshell circuit board assembly of claim 1 wherein the heat sink comprises a first heat sink mounted to the upper thermal plane and a second heat sink mounted to the lower thermal plane.

11. The clamshell circuit board assembly of claim 1 wherein the phase change material is one of paraffin wax and ammonia.

12. The clamshell circuit board assembly of claim 1 wherein the phase change material includes an additive material for high radiation heat transfer emissivity.

13. The clamshell circuit board assembly of claim 12 wherein the additive material is carbon black.

14. The clamshell circuit board assembly of claim 1 wherein the heat sink further comprises a heat conducting frame holding the phase change material.

15. The clamshell circuit board assembly of claim 14 wherein the heat conducting frame is configured as a honeycomb.

* * * * *